GERMANIUM - ZINC ALLOY SEMI-CONDUCTORS

Filed Nov. 5, 1952

Inventor:
William C. Dunlap, Jr.,
by Paul A. Frank
His Attorney.

2,776,920

GERMANIUM-ZINC ALLOY SEMI-CONDUCTORS

William C. Dunlap, Jr., Schenectady, N. Y., assignor to General Electric Company, a corporation of New York Application November 5, 1952, Serial No. 318,939

11 Claims. (Cl. 148—33)

Figure 1:
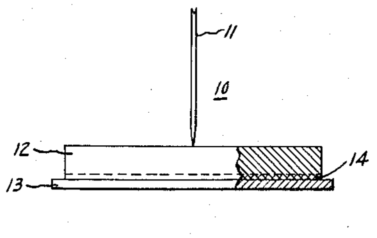

My invention relates to semi-conductor devices and more particularly to semiconductor devices having a positive-conductivity type semiconductor member or a positive conductivity type zone of a semiconductor member.

Semiconductors, such as germanium or silicon lying in group IV of the periodic table, have become conventionally classified as either positive (P-type), or negative (N-type), depending primarily upon the type and sign of their predominant conduction carriers. In P-type semiconductor, the excess conduction carriers are electron vacancies ("positive holes") produced by the movement of electrons in the valence band, while with N-type semiconductor, the excess conduction carriers are electrons moving in the conduction band. With P-type semiconductor, the direction of rectification as well as the polarity of the thermoelectric, photoelectric, or Hall effect voltage are all opposite to that produced with N-type semiconductor.

It has been found that the determinant of whether a particular semiconductor exhibits N-type or P-type characteristics lies primarily in the type of impurity elements present in the semiconductor. Some impurity elements, termed "donors" function to furnish additional free electrons to the semiconductor so as to produce an electronic excess N-type semiconductor, while other impurity elements termed "acceptors" function to absorb the electrons to create P-type semiconductor with an excess of "positive holes." These donor and acceptor impurities may generically be referred to as "activators." Only very small amounts of these activator elements are necessary to produce marked electrical characteristics of one type or the other. Concentrations of some impurities of less than one part per million may be sufficient.

P-N junction semiconductor units are units in which a zone of P-type semiconductor adjoins a zone of N-type semiconductor to form an internal space charge barrier called the "P-N junction." This P-N junction possesses marked rectifying as well as thermoelectric and photoelectric properties. An electric current may be passed easily in only one direction through this P-N junction, and a generation or modulation of electrical current may be produced between the P-type and N-type material on opposite sides of this junction by concentrating light or heat upon the junction.

It has heretofore been generally believed that only those elements which lie in group V of the periodic table, namely nitrogen, phosphorus, arsenic, and antimony are suitable as donor activators for germanium and silicon; and that only those elements which lie in group III of the periodic table, namely, boron, aluminum, gallium, and indium, may function as acceptor activators for germanium and silicon. According to prevailing theory, the atoms of the group B donor element enter into lattice bonds with the atoms of the group IV semiconductor element by contributing only four of their five valence electrons to complete the outer electron shells of the semiconductor atoms thereby releasing excess electrons for movement in the conduction band. The atoms of the group III acceptor element, on the other hand, are believed to contribute their entire three valence electrons in entering into a lattice bond with the semiconductor atoms, but this still leaves one electron vacancy in the outer atomic shell of each bonded semiconductor atom which electron vacancy becomes available for movement in the valence band. Elements lying in groups other than group III and group V were not heretofore believed to be capable of exerting similar conduction carrier inducing influence upon group IV semiconductors. The present invention relates to positive-conductivity type semiconductors and is thus concerned with the acceptor activators.

P-type semiconductor members having useful electrical characteristics must ordinarily comprise highly-purified semiconductor substantially free of all impurities other than the significant acceptor activator providing its excess positive conduction carriers. Germanium initially purified to have a resistivity above 2 ohm centimeters at room temperature is usually suitable, and the amount of acceptor activator employed to impregnate the highly purified germanium with positive conduction carriers may vary from a small trace to a considerable percentage of such acceptor impurity depending upon the electrical characteristics desired for the resulting P-type germanium member of P-type zone of such germanium members.

Various methods are currently employed to impregnate the purified semiconductor with the acceptor activator element. In one method, a monocrystalline P-type semiconductor ingot is grown by seed crystal withdrawal from a melt consisting of highly purified germanium and a trace of the acceptor impurity involved. In another method, a purified semiconductor member is heated in contact with the acceptor element until the impurity element alloys with and diffuses into a surface-adjacent region of the semiconductor member. This latter method is particularly well-suited for the production of P-N junction units, and forms a portion of the subject matter of my copending application Serial No. 187,490, filed September 29, 1950 and assigned to the present assignee.

The group III acceptor elements all have some inherent limitations and obstacles to their practical use especially in those semiconductor devices wherein it is desired that the acceptor element also be employed as an electrode-making connection to the acceptor impregnated P-type region of the semiconductor member. Boron, for example, is not a metal and does not make a good electrically conducting connection. Aluminum can be used to impregnate the semi-conductor only in an oxygen-free atmosphere, and it is quite difficult to fuse aluminum to a semiconductor because of the oxide layer normally present at the surface of the aluminum. Gallium has an undesirably low melting point and both gallium and indium are so soft that they do not make good pressure contacts. Moreover, gallium and indium do not diffuse readily into germanium and their conduction carrier inducing effect is so great that it is difficult to produce by mass production techniques a great number of P-type semiconductor members or P-type semiconductor zones having identical electrical characteristics.

Accordingly, one object of the invention is to provide a P-type semiconductor member or zone of a P-type semiconductor member in which the acceptor activator is a metal element which does not lie in group III of the periodic table. Another object is to provide a germanium P-N junction unit in which the electrode readily fuses with and diffuses into the germanium to produce a surface-adjacent P-type zone. A further object is to provide a germanium P-N junction unit in which an acceptor electrode fused to and within a surface adjacent P-type zone of the unit makes good electrical contact to such zone and is hard enough to withstand a pressure contact thereto. A still further object of the invention is to provide a P-type semiconductor member which requires considerable energy to activate its positive conduction carriers and which thus has utility as a photoconductive member when maintained at low temperatures in the range of liquid hydrogen.

In accord with the invention, my new P-type semiconductor member comprises germanium alloyed with or otherwise impregnated with highly purified zinc. If the zinc-germanium alloy members contain only a trace of zinc so as to have a resistivity above 2 ohm centimeters at room temperature they find utility in point contact rectifiers and transistors and in photoconductive units for low frequency radiant energy detection. In accord with a further feature of the invention, zinc may also constitute an electrode of a P-N junction unit in which this zinc electrode is fused to and within a surface adjacent zone of a germanium member and heavily impregnates such surface-adjacent zone with excess positive conduction carriers. A pressure contact may then be made to this zinc electrode of the resulting P-N junction unit.

Figure 3:
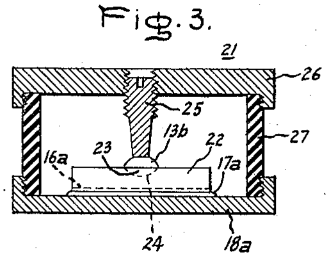
Figure 4:
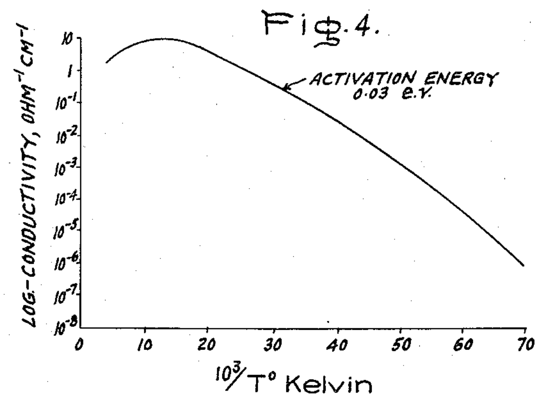

The novel features which are believed characteristic of the invention are set forth in the appended claims. The invention itself, together with further objects of the invention, may best be understood by referring to the following description taken in connection with the accompanying drawings in which Fig. 1 is a partly sectional view of a point rectifier embodying the invention, Figs. 2 and 3 are sectional views of P-N junction rectifiers embodying the invention, and Fig. 4 is a curve illustrating the activation energy required at various temperatures for energizing positive conduction carriers in a semiconductor member constructed in accord with the invention.

Referring now to Fig. 1, the invention is shown embodied in a semi-conductor rectifier 10 of the point contact type. A pointed metal wire electrode or "whisker" 11 made, for example, of steel, nickel, Phosphor-bronze, or tungsten, and containing at least a trace of a donor activator is supported in substantially punctiform contact with a surface of a semiconductor member 12 consisting of germanium and a trace of zinc. Germanium member 12 may conveniently have length and width dimensions about 0.30" and a thickness dimension about 0.020" and may be extracted from a monocrystalline ingot grown by seed crystal withdrawal from a melt consisting of highly purified germanium and a trace, no more than 0.05% by weight, of zinc. Because of the low segregation constant of zinc relative to germanium, only a much smaller percentage, no more than 0.001% of zinc will be actually assimilated by the growing ingot. Semiconductor member 12 may be considered an alloy of germanium and zinc even though the zinc is present in only minute amounts. The bulk resistivity of semiconductor member 12 is preferably above 2 ohm centimeters. To this end, the actual amount of zinc present in semiconductor member 12 is preferably between 0.00001% and 0.001% by weight of the total germanium-zinc members. A second electrode 13, preferably also consisting of highly purified zinc, is connected over a large surface area remote from the point of contact between electrode 11 and semiconductor member 12. Zinc electrode 13 is fused to and within a surface adjacent region 14 of wafer 12. The fusion may be accomplished by heating the zinc in contact with the germanium body, preferably under slight pressure, for about 1 minute at a temperature in the neighborhood of 400° C. The time and temperature are not critical. The heat must only be sufficient to cause zinc electrode 13 to wet and alloy with the semiconductor wafer 12. Alternatively, zinc electrode 13 may constitute a vapor-deposited film which fuses to and diffuses with a surface-adjacent zone during the vapor deposition process. Region 14 thus becomes heavily impregnated with zinc and contains a much greater concentration of positive conduction carriers than the remainder of wafer 12. Region 14 acts as a reservoir of positive conduction carriers enabling a greater forward current conduction than would be the case if region 14 did not contain such excess positive conduction carriers.

The rectifier thus formed is then subjected to an electric pulsing treatment wherein a current pulse of a few hundred milliamperes is passed in the forward direction through the diode in order to impregnate the whisker contact area of wafer 12 with excess donor activities supplied from the whisker electrode 11. Rectifier 10 passes a substantial forward current of the order of 100 milliamperes when electrodes 13 is at a low positive potential with respect to electrode 11 and passes relatively little current, less than a few microamperes, when electrode 13 is at a high negative potential, for example —200 volts, relative to electrode 11.

Figure 2:
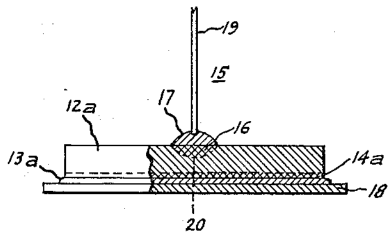

Referring now to Fig. 2, the invention is shown embodied in a P-N junction type rectifier 15. A germanium wafer **12*a* similar to wafer 12 of Fig. 1 has one surface-adjacent zone 16 fused to and with a donor electrode element 17 and has a different surface adjacent zone 14*a* fused to and with a zinc solder electrode 13*a* which is also employed to make connection to a metal terminal plate 18. A second conductor 19 which functions as the other terminal of the rectifier is fused to or embedded within donor electrode 17. Donor electrode 17 may conveniently consist of antimony and is fused with and diffused into N-type zone 16 by being heated for about one minute in contact with germanium wafer 12 at a temperature about 650° C. The antimony donor impurity introduced into zone 16 induces a great excess of negative conduction carriers (electrons) in this region and converts this region to N-type material such that a P-N junction 20 is formed between this N-type zone 16 and the remainder P-type portion of wafer 12*a*. P-N junction rectifiers 15** typically pass several amperes at one volt in the forward direction and less than 50 microamps in the reverse direction with a reverse voltage over 200 volts.

Referring now to Fig. 3, further features of the invention are shown in connection with a P-N junction rectifier 21. Rectifier 21 includes an N-type germanium wafer 22 similar in dimensions and resistivity to wafters 12 and **12*a* of Figs. 1 and 2 but having opposite type conduction characteristics. N-type wafer 22 has one P-type surface-adjacent region 23 fused to and impregnated with zinc electrode 13*b*. A P-N junction 24 is formed between zinc impregnated P-type region 23 and the remainder of N-type wafer 22. A second surface adjacent region 16*a* is fused to and impregnated with a donor-containing solder 17*a* which also serves to bond a metal conductor 18*a* in electrically conductive relation with N-type region 16*a*. A screw type conductor 25 is threaded within a cap 26 of a housing 27 and presses against the upper surface of zinc electrode 13*b*. The hardness of zinc electrode 13*b* is sufficient to withstand this pressure contact. Cap 26 may constitute an electrically conducting terminal for rectifier 21. The rectifying characteristics of rectifier 21 are similar to those of rectifier 15 of Fig. 2, but in a reverse direction relative to the polarity of the applied voltage. N-type wafer 22** is preferably monocrystalline and may be prepared in accord with any of the wellknown techniques for preparing N-type semiconductors for use in rectifiers.

Another useful property of germanium-zinc alloy members in accord with the invention is shown in the curve A of Fig. 4. Curve A represents logarithmic conductivity plotted against the reciprocal of absolute temperature for a single crystal of germanium impregnated with a trace, no more than .001%, of highest purity (99.99%) zinc. The activation energy required for exciation of positive type conduction carriers from the zinc can be obtained from the slope of this curve, and the value is found to be about 0.031 electron volts over the temperature range of liquid hydrogen (12° K.–21° K.). This is to be contrasted with activation energy values ranging from 0.003 to 0.008 for germanium single crystals impregnated with traces of acceptor impurities lying in group III of the periodic table. This high activation energy of my new zinc-germanium alloys at temperatures in the range of liquid hydrogen make such alloys suitable for use in photoconductive devices since a small change in radiant energy incident upon such germanium-zinc alloys at these low temperatures produces a large change in electrical resistivity of the unit. The wave length of the radiant electromagnetic energy which produces such change in resistivity lies in the neighborhood of 38 microns which corresponds to light of the lower infrared band of the spectrum. Photoconductive units maintained at these low temperatures may thus be used to detect the presence of light of this general band of wave lengths.

It will thus be seen that I have provided a new P-type semiconductor member or zone of a semiconductor member which utilizes an acceptor activator which does not lie in group III of the periodic table and which has properties which also make it well suited for use as an electrode connected to such P-type semiconductor member or region. In addition, the P-type semiconductor alloys of the invention are suitable for use as the photoconductive elements in radiant energy detectors when maintained at low temperatures in the range of liquid hydrogen.

Although I have disclosed specific embodiments of my invention, many modifications may be made. It is to be understood that I intend by the appended claims to cover all such modifications as fall within the true spirit and scope of the invention.

What I claim as new and desire to secure by Letters Patent of the United States is:

1. A semiconductor member consisting of P-type germanium impregnated with from 0.00001% to 0.001% by weight of zinc.

2. A positive conductivity type semiconductor comprising P-type germanium containing from 0.00001% to 0.001% by weight of zinc and having a resistivity at room temperature above 2 ohm centimeters.

3. A semiconductor member having a positive conductivity type zone consisting essentially of germanium impregnated with from 0.00001% to 0.001% by weight of zinc.

4. A semiconductor unit comprising a germanium member having one zone impregnated with from 0.00001% to 0.001% by weight of zinc, and another contiguous and surface adjacent zone impregnated with a much greater percentage of zinc.

5. A P-N junction semiconductor unit comprising a germanium member having an N-type zone and a P-type zone, said P-type zone being impregnated with from 0.00001% to 0.001% by weight of zinc.

6. A semiconductor unit comprising a germanium member impregnated with from 0.00001% to 0.001% by weight of zinc and having a resistivity at room temperature above 2 ohm centimeters and an electrode consisting of zinc fused to and within a surface adjacent zone of said member.

7. A semiconductor unit consisting of a monocrystalline germanium member impregnated with from 0.00001% to 0.001% by weight of zinc and having an activation energy about 0.03 electron volts at temperatures in the range of liquid hydrogen.

8. A P-N junction semiconductor unit comprising a germanium member having an N-type zone and a surface-adjacent P-type zone impregnated with from 0.00001% to 0.001% by weight of zinc, and a zinc electrode fused to and within said P-type zone.

9. A semiconductor device comprising a germanium member having a surface adjacent P-type zone impregnated with from 0.00001% to 0.001% by weight of zinc and a zinc electrode fused to and within said P-type zone, and an electric conductor pressed against a surface of said zinc electrode.

10. A semiconductor member consisting of an alloy of more than 99.999% of germanium and a trace, no more than 0.001% by weight of zinc.

11. A semiconductor member consisting of an alloy of germanium and zinc, said zinc being present in amounts between .00001% and .001% by weight of said total alloy.

References Cited in the file of this patent

UNITED STATES PATENTS 2,588,253 Lark ---------------- Mar. 4, 1952

OTHER REFERENCES

NRL Report 4049 entitled "Colloquiun on Transistors in Theory and Practice," published by Naval Research Labty., Washington, D. C., May 21, 1952, pp. 1 and 2.